(12) United States Patent
Zhang et al.

(10) Patent No.: US 6,601,123 B1
(45) Date of Patent: Jul. 29, 2003

(54) METHOD AND APPARATUS TO CONTROL THE SIGNAL DEVELOPMENT RATE OF A DIFFERENTIAL BUS

(75) Inventors: Binglong Zhang, Portland, OR (US); Roland Pang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/471,797

(22) Filed: Dec. 23, 1999

(51) Int. Cl.[7] .................. G06F 17/00; H03K 19/003; H03K 19/175; G05F 1/10; G11C 7/00
(52) U.S. Cl. ........................ 710/305; 326/86
(58) Field of Search ............... 710/305; 340/286.02; 326/21, 86; 327/1, 70, 40, 77; 324/73.1; 711/118

(56) References Cited

U.S. PATENT DOCUMENTS

| | | | | |
|---|---|---|---|---|
| 4,994,690 A | * | 2/1991 | Sundstrom et al. |
| 5,416,743 A | * | 5/1995 | Allan et al. |
| 5,778,204 A | * | 7/1998 | Van Brunt et al. |
| 5,977,797 A | * | 11/1999 | Gasparik |
| 6,160,423 A | * | 12/2000 | Haq |
| 6,188,271 B1 | * | 2/2001 | Wang et al. |

* cited by examiner

*Primary Examiner*—Gopal C. Ray
(74) *Attorney, Agent, or Firm*—Cynthia T. Faatz

(57) ABSTRACT

A differential bus having a controllable differential signal development rate. A differential signal development rate control circuit is provided to control the development rate of a differential signal on a differential bus.

22 Claims, 5 Drawing Sheets

METHOD AND APPARATUS TO CONTROL THE SIGNAL DEVELOPMENT RATE OF A DIFFERENTIAL BUS

BACKGROUND

1. Field

An embodiment of the present invention relates to the field of integrated circuit design, and more particularly, to design of a differential bus.

2. Discussion of Related Art

In microprocessors, for example, including large, high-speed on-chip cache memories has been shown to be a cost-effective way to improve microprocessor performance. Large on-chip cache memories provide for more data to be stored on-chip such that more time consuming off-chip memory accesses are reduced.

To take advantage of improved data locality provided by a large on-chip cache memory, it is desirable to have a high performance bus that can transfer data read from the cache memory to other parts of the microprocessor. It is also desirable for such a bus to be power and area efficient.

Designing such a bus can present many challenges. A full signal swing bus (i.e. signals communicated over the bus can transition rail-to-rail from a ground voltage to a power supply voltage) may consume an unacceptable amount of power and take up excessive space on the integrated circuit die.

A low voltage swing bus may consume less power and take up less space on the die, but there may be other disadvantages. For a typical low voltage swing bus, two bus lines are provided for each bit of information to be communicated and data is provided in the form of a differential signal. A sense amplifier enable (SAE) signal is used to sense data communicated over the bus. For one low voltage swing bus, the SAE signal is provided by a self-timed circuit wherein the data to be communicated is provided during one phase of a bus clock and the SAE signal is generated in a following phase. This approach can be slow and thus, not provide a high enough performance level for some applications. Further, the self-timed SAE signal may be difficult to control. Various factors such as non-uniformity in circuits across the processor or other integrated circuit device over which the bus traverses can lead to clock jitter, clock skew, noise, etc. that may each cause variations in the SAE signal. Looser bus timings may then be used to compensate for such variations.

For another low voltage swing bus, such as the bus 100 in FIG. 1, a self-timed SAE signal 105 provided by a SAE signal generator circuit 1 10 may be tunable to adjust the placement of the SAE signal rising edge. While a tunable self-timed SAE signal may provide for some additional control over the SAE signal 105 placement, for a high frequency microprocessor, for example, the tunable range may be limited. Further, providing a tunable SAE signal may be risky for such a high frequency device because, if the edge of the SAE signal is adjusted too far, the tuned SAE signal may cause erroneous data to be latched.

While a bus coupled to an on-chip cache memory is described above, it will be appreciated that other high performance integrated circuits that use an on-chip bus may present similar issues.

SUMMARY OF THE INVENTION

A method and apparatus to control a signal development rate for a differential bus are described. In accordance with one embodiment, an apparatus includes a differential bus and a differential signal development rate control circuit to control the development rate of a differential signal on the differential bus.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus to control the signal development rate for a differential bus are described. In the following description, integrated circuit and system configurations are described for purposes of illustration. It will be appreciated, however, that other embodiments are applicable to systems and integrated circuits configured in another manner.

For one embodiment, a differential signal development rate control circuit is programmable to adjust a development rate of a differential signal on a bus. By adjusting the differential signal development rate in accordance with various embodiments, it may be possible to improve the robustness of the bus against clock skew, clock jitter, noise and/or device non-uniformity and/or to reduce power consumption.

Figure 1:
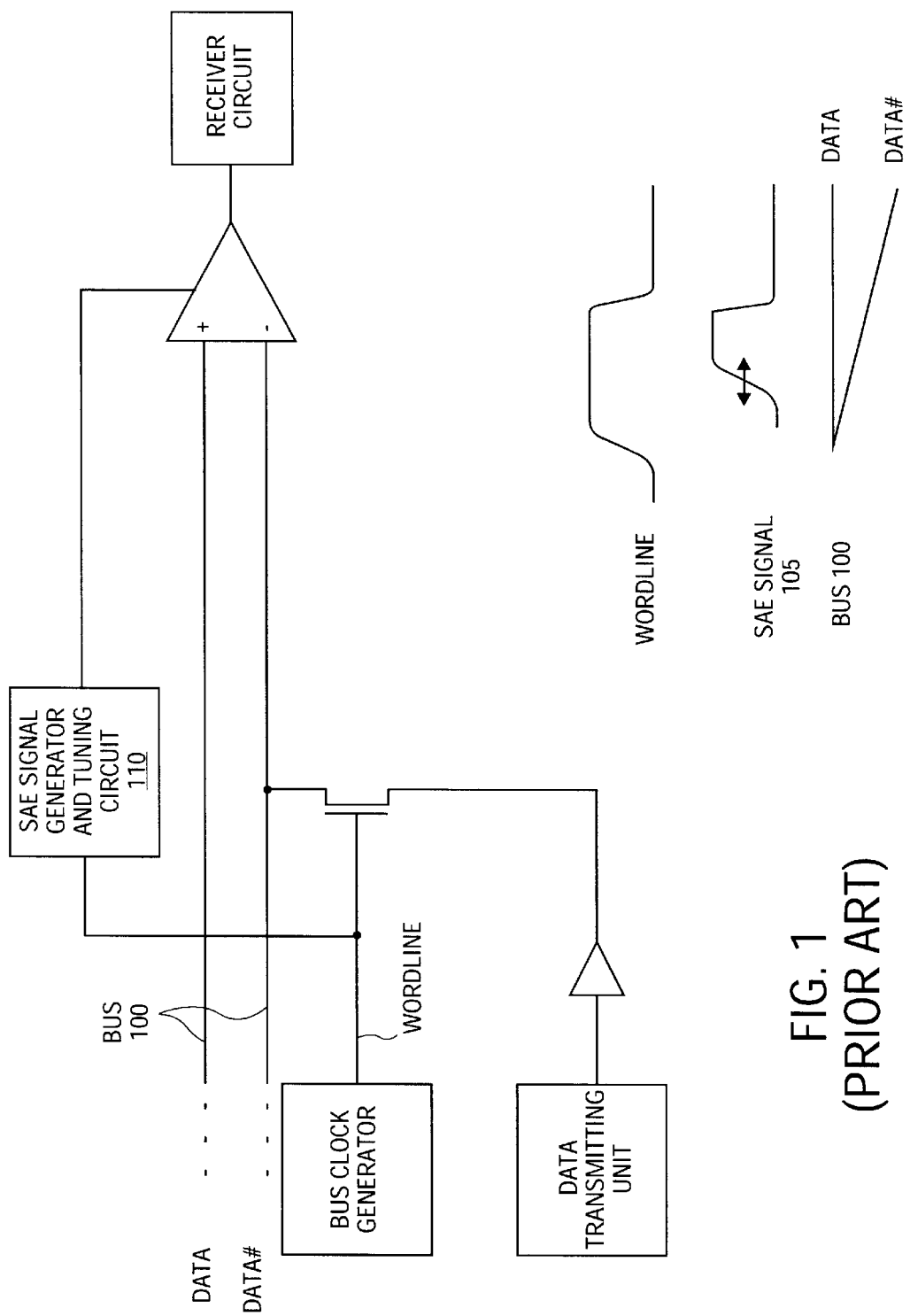
FIG. 1 is a diagram showing a prior differential bus circuit.
Figure 2:
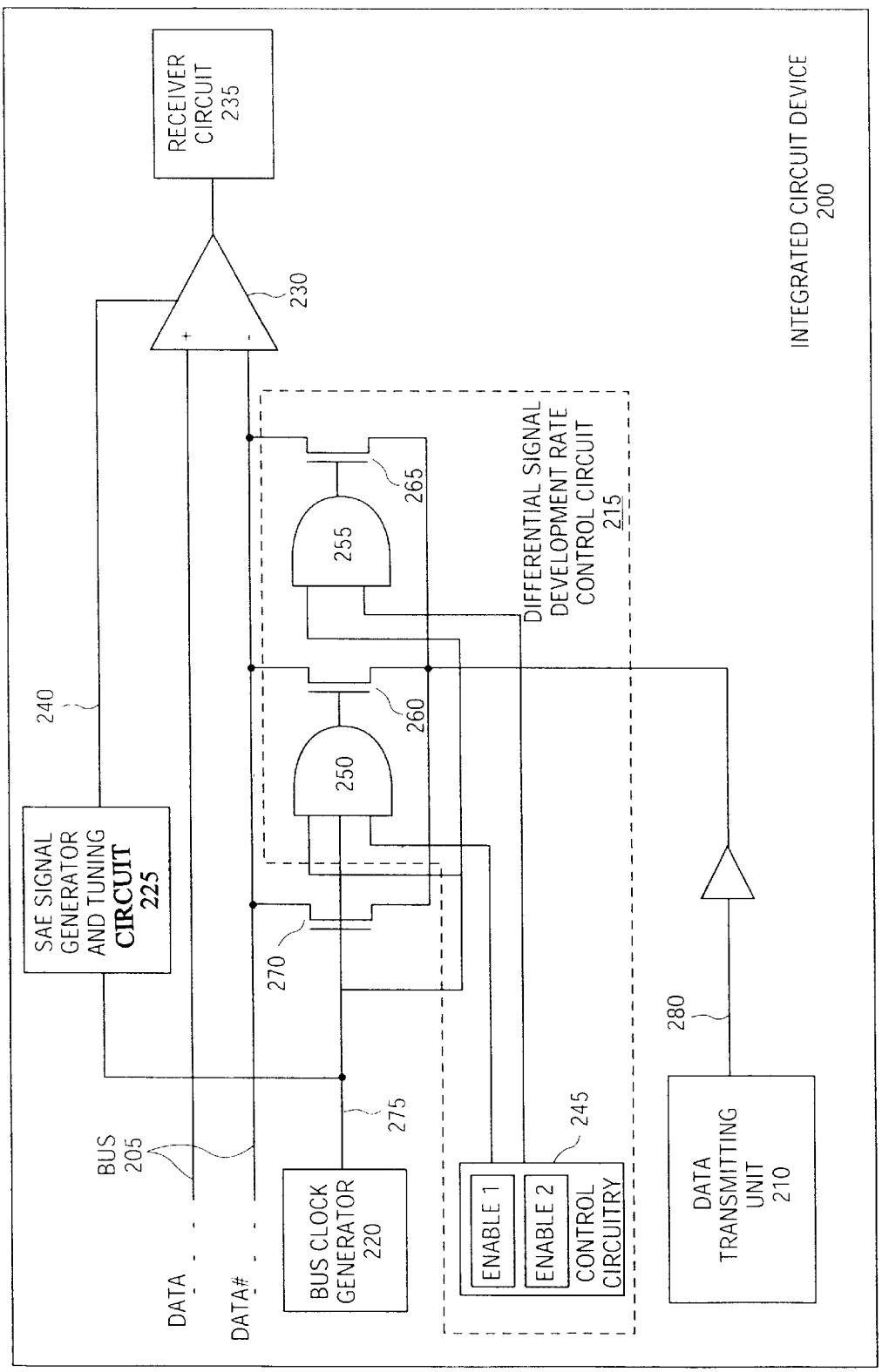
FIG. 2 is diagram showing an integrated circuit device including a differential bus and a differential signal development rate control circuit in accordance with one embodiment.

FIG. 2 is a block diagram of an integrated circuit device 200 including a differential bus 205 in accordance with one embodiment. The integrated circuit device 200 of FIG. 2 may be, for example, a microprocessor for one embodiment, however, it will be appreciated that other types of integrated circuits devices may be used for other embodiments.

In addition to the bus 205, the integrated circuit device 200 includes a data transmitting unit 210, a differential signal development rate control circuit 215, a bus clock generator 220, a sense amplifier enable (SAE) signal generator and tuning circuit 225, a sense amplifier (sense amp) 230, and a receiver circuit 235.

The bus 205 may be a data bus or an address bus, for example. The terms data and information are used interchangeable herein to refer to any type of information that may be transmitted over the bus 205.

For the embodiment shown in FIG. 2, the bus 205 is a differential bus that includes two bus lines, DATA and DATA#, for each bit of information to be transmitted over the bus 205. A differential signal is a set of two voltages {v, v#} on the signal lines DATA and DATA# where v>v# indicates a logical 1 value and v#>v represents a logical 0 value.

For one embodiment, the differential bus 205 is a low voltage swing bus such that the voltage differential between the DATA and DATA# bus lines that is sensed by the sense amp 230 may be small. Low voltage swing signals, as the term is used herein, refer to signals with a smaller voltage swing than that of full swing signals. In some cases, the voltage swing can be substantially smaller than that of full swing signals. For one implementation of the low voltage swing bus described herein, for example, the small swing signals may have a voltage swing as low as 100 mV or, in some cases, even lower.

The sense amp 230 senses a voltage differential between the DATA and DATA# bus lines in response to receiving a sense amp enable signal from the SAE signal generator and tuning circuit 225 over the signal line 240 and provides the equivalent logic value at its output. Where the receiver circuit 235 is a full swing circuit (i.e. signals transition from rail-to-rail), the sense amp 230 provides a full swing signal to the receiver circuit 235 in response to sensing a low voltage swing signal on the bus 205.

FIG. 2 shows bus lines DATA and DATA# and supporting bus circuitry corresponding to one bit of the bus 205. It will be appreciated that the DATA and DATA# bus lines, the differential signal development rate control circuit 215, the sense amp 230 and a read gate 270 are each replicated for each bit of the bus 205. Thus, the description herein of these elements also applies to the replicated elements.

The differential signal development rate control circuit 215 controls the rate at which the differential signal develops on the bus 205 as described in more detail below. For one embodiment, the differential signal development rate control circuit 215 includes control circuitry 245, AND gates 250 and 255, and programmable read gates 260 and 265. The control circuitry 245 may include programmable control registers such as registers ENABLE1 and ENABLE2, for example. Other types of control circuitry such as a state machine, for example, may be provided for other embodiments.

In operation, the bus 205 is precharged for one embodiment such that both the DATA and DATA# bus lines are at predetermined levels. The bus 205 may be precharged low (e.g. to ground), for example. For other embodiments, the bus may be precharged high (e.g. to Vcc).

The data transmitting unit 210 provides data to be transmitted over the bus 205 on a signal line 280 that may include one or more buffers. The data transmitting unit 210 may be any type of element that communicates information over the bus 205. The data transmitting unit may, for example, be a cache memory, however, other types of units that transmit data over an on-chip bus may also be used. The data provided by the data transmitting unit may be in response to a READ operation from another unit in the integrated circuit device 200, for example.

The bus clock generator 220 generates a bus clock signal, that may be used as a wordline signal, that is communicated to the SAE signal generator and tuning circuit 225 and the read gate 270 over a signal line 275. The bus clock generator 220 may, for example, derive the wordline signal from a core clock signal generated elsewhere on the integrated circuit device 200 or from another type of clock signal.

Figure 3:
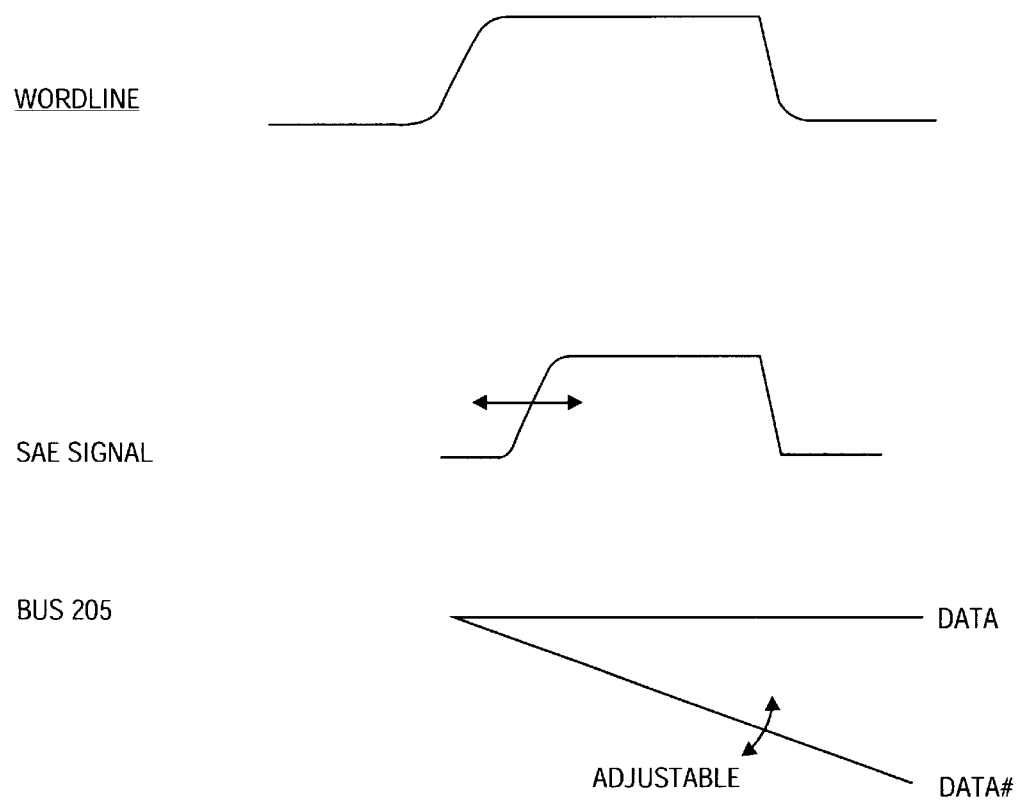
FIG. 3 is a timing diagram showing a timing relationship between some signals of FIG. 2.

For the embodiment of FIG. 2, a rising edge of the wordline signal causes the read gate 270 to be turned on such that data from the data transmitting unit 210 is communicated to the DATA# line of the bus 205. In response to the data provided by the data transmitting unit 210, a voltage differential begins to develop between the DATA and DATA# lines in response to turning on the read gate 270 as shown in FIG. 3.

The SAE signal provided by the SAE signal generator and tuning circuit 225 determines when data on the bus 205 is sensed. For performance reasons, it is desirable for the SAE signal to be generated as soon as possible after valid data can be sensed from the bus 205. In order for valid data to be sensed from the bus 205, there may be a minimum differential voltage between the DATA and DATA# signals. Thus, the faster the differential signal development rate, the sooner the SAE signal may be triggered and the data sensed by the sense amp 230. In this manner, the differential signal development rate may help to determine the performance of the bus 205.

In contrast to prior differential buses, the bus 205 of FIG. 2 includes a differential signal development rate control circuit 215 that enables adjustment of the differential signal development rate such that it may be possible to sense valid data earlier. For one embodiment, the differential signal development rate control circuit 215 is programmable through control registers ENABLE1 and ENABLE2 included within control circuitry 245. If ENABLE1 and/or ENABLE2 store logical high values, corresponding AND gates 250 and/or 255 provide a logic high value at their outputs in response to a rising edge of the wordline signal on the signal line 275. This logic high value at the output(s) of AND gates 250 and/or 255 turns on corresponding programmable read gates 260 and/or 265.

Each of the programmable read gates 260 and 265 receives the data signal from the data transmitting unit 210 over the signal line 280 at the same time that the signal is transmitted to the read gate 270. Thus, turning on one or more of the programmable read gates 260 and/or 265 increases the driving strength applied to the DATA# bus line. In this manner, the rate at which a differential signal is developed between the DATA and DATA# bus lines in response to reading data from the data transmitting unit 210 may be increased.

For one embodiment, in order to determine whether to program one or both of the ENABLE1 and/or ENABLE2 control registers (or more control registers, if provided), characterization type tests may be performed on representative die from a particular manufacturing run, for example. The tests may evaluate particular bus-related timings to determine whether an adjustment to the differential signal development rate would improve performance and to what extent it is helpful to adjust the differential signal development rate. A goal for one embodiment is to provide correct functionality with a desirable safety margin. It may be undesirable to adjust the signal development rate to be faster than necessary to achieve this goal as a faster signal development rate will cause a larger differential and, therefore, increase power dissipation.

During the above tests, the ENABLE1 and/or ENABLE2 control registers may be programmed via external software, by providing a predetermined code through a test access port of the integrated circuit device 200, through one or more special instruction sequences, etc.

For some embodiments, the ENABLE1 and ENABLE2 storage elements include fuses. Thus, once it has been determined whether one or more of the additional gates 260 and/or 265 is to be enabled during a read operation, fuses corresponding to the ENABLE1 and/or ENABLE2 storage elements may be blown to provide the desired differential signal development rate control. Where representative devices are tested, the same fuses may be blown for each device from the same manufacturing run, for example.

For another embodiment, the ENABLE 1 and ENABLE 2 storage elements may also include registers that may be temporarily programmed during testing. These temporary storage elements may be logically OR'd with the fuses such that once it is determined whether one or both of the storage elements are to be programmed, one or more of the fuse(s) can be burned.

Other approaches to programming the ENABLE 1 and/or ENABLE2 storage elements and/or other approaches to controlling programmable read gates are also within the scope of various embodiments.

The timing of the SAE signal provided by the SAE signal generator and tuning circuit 225 can be determined and adjusted based on the differential signal development rate controlled by the differential signal development rate control circuit 215. The SAE signal may be delayed from the wordline signal, for example, by an amount of time sufficient to allow for the minimum differential voltage to develop between the DATA and DATA# signal lines.

Additionally, the precise placement of an edge of the SAE signal may be tuned within a relatively small range by the SAE signal generator and tuning circuit 225 via control inputs (not shown). The control inputs of the SAE signal generator and tuning circuit 225 may be accessible via control registers and/or other control circuitry (not shown), for example. The manner in which the SAE signal edge may be adjusted is well-known to those of ordinary skill in the art. An example of the SAE signal in relation to the wordline signal of one embodiment is shown in FIG. 3.

It will be appreciated that while two programmable read gates 260 and 265 and associated logic 250 and 255 are shown in FIG. 2, a different number of programmable read gates may be included in other embodiments to provide for a smaller or larger signal development rate adjustment flexibility. As additional programmable read gates are added, the extent to which the signal development rate is increased continues to diminish. Thus, the number of programmable read gates and corresponding control logic to be used for a particular bus implementation may be determined, for example, by striking a balance between available area and a desired signal development rate.

While AND gates are shown in FIG. 2 to control the programmable read gates 260 and 265, other types of logic that provide similar functionality may be used for other embodiments. Similarly, while the read gates 260, 265 and 270 of FIG. 2 are n-type complementary metal oxide semiconductor (NMOS) gates, one or more of the read gates may be a different type of gate for other embodiments.

Figure 4:
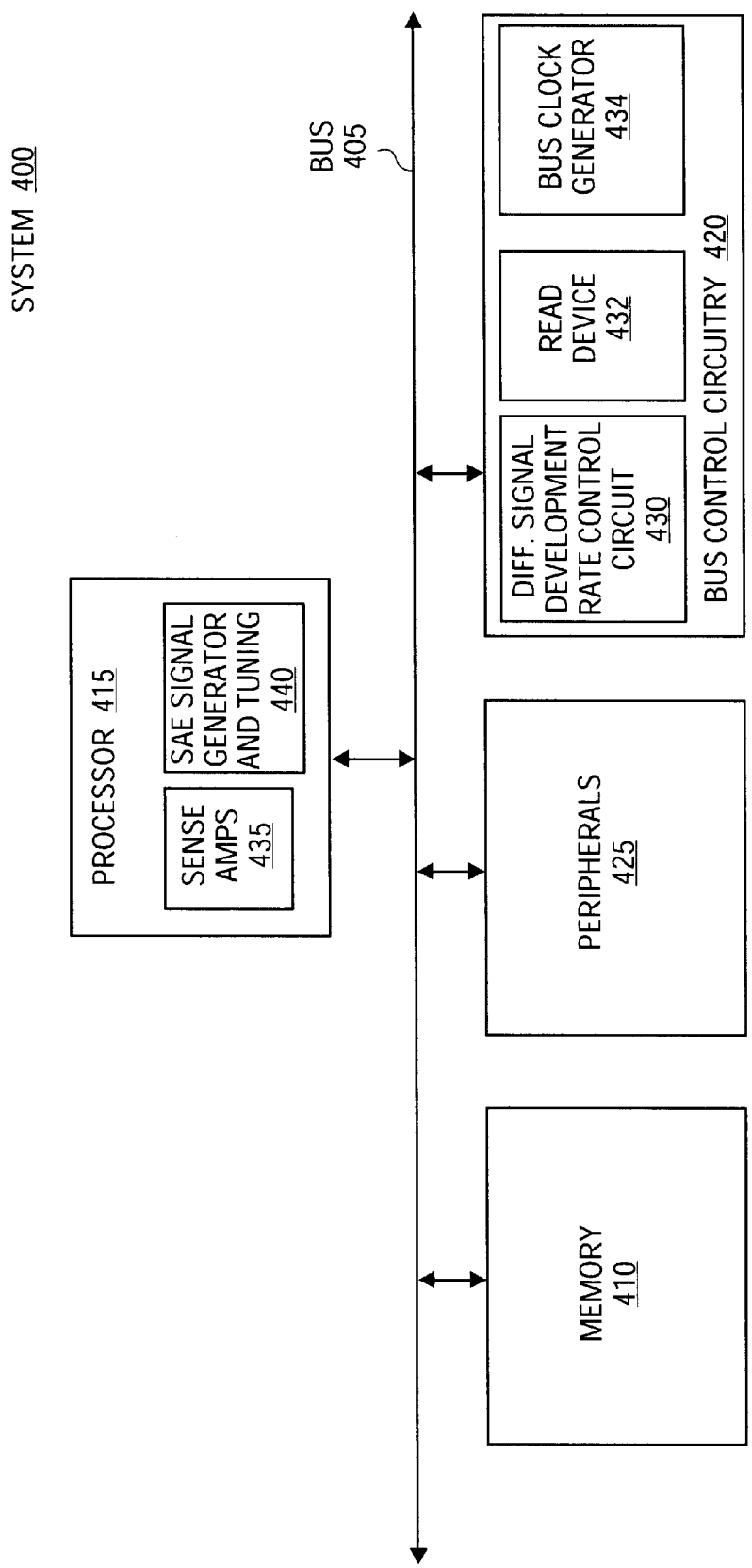
FIG. 4 is a block diagram showing a system including a differential bus in accordance with one embodiment.

The differential bus of one embodiment has been described above as an on-chip bus. For other embodiments, however, a similar approach may be used for an inter-chip bus, for example. FIG. 4 is a block diagram of a system 400 including a bus 405 in accordance with such an embodiment. The system 400 may, for example, be a computer system, however, other types of systems, including systems configured in another manner, are within the scope of various embodiments. The bus 405 is a differential bus that operates in a similar manner to the bus 205 to communicate information between components of the system 400 such as a memory 410 and a processor 415. While only one line is shown for the bus 405, it will be appreciated that the bus 405 includes DATA and DATA# signal lines for each bit of the bus 405.

In addition to the bus 405, the memory 410 and the processor 415, the system 400 also includes bus control circuitry 420, which for one embodiment, is incorporated in a chipset or within the memory 410, for example. Additionally, the system 400 may include one or more peripherals 425 such as, for example, one or more input and/or output devices such as a keyboard, cursor control device, monitor and/or printer, for example, a mass storage device, etc.

The bus control circuitry 420 includes a differential signal development rate control circuit 430 that operates and is programmable in a similar manner to the differential signal development rate control circuit 215 of FIG. 2. The bus control circuitry 420 may also include a read device 432 similar to the read device 270 of FIG. 2 and a bus clock generator 434 similar to the bus clock generator 220.

Data may be transferred to the bus 405 by the memory 410 in response to a read request from the processor 415, for example. The differential signal development rate control circuit 430 controls the rate at which a differential signal develops on the bus 405 in response to receiving the data as described above.

A sense amp 435 in the processor 415 controlled by an SAE signal generator and tuning circuit 440 in the processor 415 senses the data on the bus 405 in a similar manner to corresponding circuit elements of FIG. 2.

In this manner, the signal development rate of a system bus, such as an address or data bus, for example, may be controlled by the differential signal development rate control circuit 430. Similar to the differential signal development rate control circuit 215 of FIG. 2, the differential signal development rate control circuit 430 may be programmed following characterization type tests or other system level tests, for example to determine a desirable signal development rate.

Figure 5:
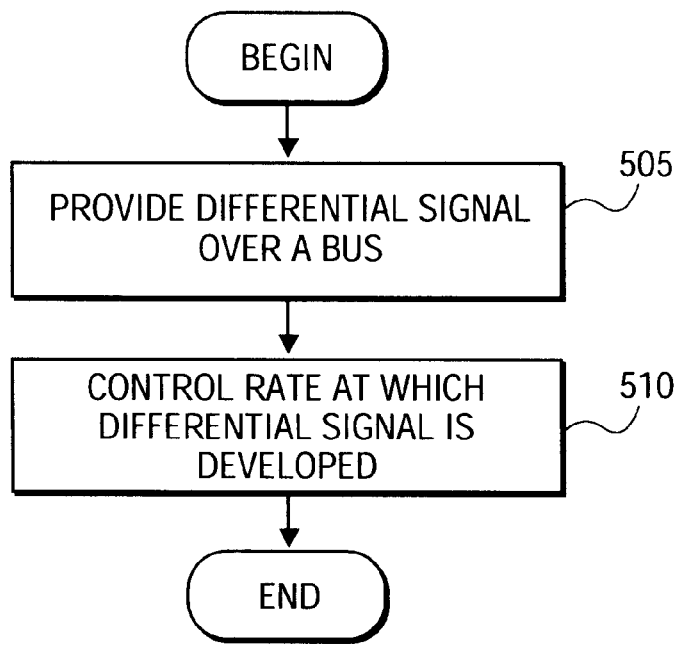
FIG. 5 is a flow diagram showing a method of one embodiment for providing a data over a bus.

FIG. 5 is a flow diagram showing a method of one embodiment for providing data over a bus. At block 505, a differential signal is provided over a bus and at block 510, a rate at which the differential signal is developed is controlled.

For other embodiments, other actions may be included such as determining a desired differential signal development rate, and programmably adjusting the differential signal development rate.

In accordance with the above-described embodiments, a differential signal development rate of a differential bus may be controlled. By controlling the differential signal development rate, it may be possible to improve device and/or system performance by improving robustness against clock skew, clock jitter, noise and/or on-chip device non-uniformity. This improvement is provided because it may be possible to sense valid data earlier such that tighter bus timings may be used. Further, by being able to sense valid data earlier, variations in SAE signal edge placement due to clock skew, clock jitter, noise, etc. do not cause invalid data to be read as frequently as for prior bus implementations.

The ability to control the differential signal development rate may also help to further optimize system or device performance in some cases. The edge placement of the SAE signal may be tuned in conjunction with adjusting the differential signal development rate to possibly identify a "sweet spot" in terms of bus performance. For a high frequency device, the adjustability of the differential signal development rate helps to improve performance without unduly increasing a risk of reading erroneous data.

Additionally, in accordance with some of the above-described embodiments, it may be possible to save area and power over prior bus implementations by using a low swing bus.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:

a differential bus; and a differential signal development rate control circuit to control the development rate of a differential signal on the differential bus.

2. The apparatus of claim 1 wherein the differential signal development rate control circuit includes at least one read gate to be selectively coupled to the differential bus during a read operation that transfers data to the bus.

3. The apparatus of claim 2 wherein the differential signal development rate control circuit further includes control circuitry to selectively couple the at least one read gate to the differential bus during the read operation.

4. The apparatus of claim 3 wherein the control circuitry includes at least one memory element that is programmable to control the selective coupling of the at least one read gate.

5. The apparatus of claim 1 further including:

a sense amplifier coupled to the differential bus to sense data on the bus; and a sense amplifier signal generator coupled to the sense amplifier to provide a sense amplifier enable signal, the sense amplifier enable signal to control the sense amplifier, the sense amplifier signal generator further being tunable to adjust a placement of an edge of the sense amplifier enable signal.

6. The apparatus of claim 1 further including:

a first read gate to be coupled to the differential bus during a read operation to transfer data to the differential bus, wherein the differential signal development rate control circuit includes at least a second read gate to be selectively coupled to the differential bus concurrently with the first read gate to increase the development rate of the differential signal.

7. The apparatus of claim 6 wherein the differential signal development rate control circuit further includes at least one programmable memory element that is programmable to selectively couple the at least second read gate to the differential bus during the read operation.

8. A method comprising:

providing a differential signal on a bus; and controlling the development rate of the differential signal.

9. The method of claim 8 further including coupling a read gate to the differential bus during a read operation, wherein controlling the development rate of the differential signal includes selectively coupling one or more additional read gates to the differential bus concurrently with coupling the read gate.

10. A method comprising:

determining a desired differential signal development rate for a differential bus; and programmably adjusting the differential signal development rate.

11. The method of claim 10 wherein programmably adjusting the differential signal development rate includes storing a value in at least one memory element.

12. The method of claim 11 wherein programmably adjusting the differential signal development rate further includes determining whether to couple a read gate to the differential bus in response to a value stored in the at least one memory element.

13. A system comprising:

a differential bus;

a memory coupled to the differential bus;

a processor coupled to the differential bus; and a bus control unit coupled to the differential bus, the bus control unit to control a development rate of a differential signal on the differential bus.

14. The system of claim 13 wherein the differential bus is a low voltage swing differential bus.

15. The system of claim 13 wherein the bus control unit includes at least one read gate to be selectively coupled to the differential bus to increase a differential signal development rate of the differential bus.

16. An apparatus comprising:

a data transmitting unit;

a plurality of read gates, wherein each read gate of the plurality of read gates is to selectively couple the transmitting unit to a differential bus; and control circuitry to selectively enable at least one read gate of the plurality of read gates to control the driving strength with which the data transmitting unit drives a differential signal to the differential bus.

17. The apparatus of claim 16, wherein the data transmitting unit is a cache memory.

18. The apparatus of claim 16, further comprising a bus clock generator to provide a wordline signal to time the selective enabling of the at least one read gate.

19. The apparatus of claim 16, wherein the control circuitry is comprised of at least one register to control the selective enabling of the at least one read gate.

20. A method comprising:

transmitting a signal to a plurality of read gates, wherein each read gate is coupled to a differential bus; and selectively enabling at least one read gate of the plurality of read gates to control the driving strength with which the signal is driven to the differential bus.

21. The method of claim 20, further comprising determining a desirable signal development rate from at least one characterization test.

22. The method of claim 21, further comprising programming a control circuit to control the rate at which a differential signal develops on the differential bus.

* * * * *

UNITED STATES PATENT AND TRADEMARK OFFICE
CERTIFICATE OF CORRECTION

PATENT NO.    : 6,601,123 B1  
DATED         : July 29, 2003  
INVENTOR(S)   : Zhang et al.

It is certified that error appears in the above-identified patent and that said Letters Patent is hereby corrected as shown below:

Column 2,
Line 50, delete "circuits" and insert -- circuit --.

Signed and Sealed this

Twenty-fourth Day of February, 2004

JON W. DUDAS  
*Acting Director of the United States Patent and Trademark Office*